United States Patent [19]

Kim et al.

[11] Patent Number: 5,041,397
[45] Date of Patent: Aug. 20, 1991

[54] METHOD OF FABRICATING A SEMICONDUCTOR DEVICE

[75] Inventors: Nam-Yoon Kim, Seoul; Si-Choon Park, Puchun, both of Rep. of Korea

[73] Assignee: Samsung Electronics Co., Ltd., Suwon, Rep. of Korea

[21] Appl. No.: 306,310

[22] Filed: Feb. 3, 1989

[30] Foreign Application Priority Data

Jun. 30, 1988 [KR] Rep. of Korea .................. 1988-8039

[51] Int. Cl.⁵ .................................. H01L 21/02
[52] U.S. Cl. .................................. 437/240; 437/981;
148/DIG. 42; 148/DIG. 161
[58] Field of Search ........... 148/DIG. 133, DIG. 161,
148/DIG. 42; 437/240, 982, 981

[56] References Cited

U.S. PATENT DOCUMENTS

| | | | |
|---|---|---|---|
| 3,793,070 | 2/1974 | Schoolar | 117/201 |
| 3,969,743 | 7/1976 | Gorski | 357/4 |
| 4,066,481 | 1/1978 | Manasevit et al. | 148/174 |
| 4,154,631 | 5/1979 | Schoolar | 148/175 |
| 4,263,604 | 4/1981 | Jensen et al. | 357/30 |
| 4,582,745 | 1/1984 | Schuable | 437/982 |

FOREIGN PATENT DOCUMENTS

| | | | |
|---|---|---|---|
| 0060613 | 9/1982 | European Pat. Off. | 437/982 |
| 2538947 | 3/1977 | Fed. Rep. of Germany | . |
| 0162233 | 12/1980 | Japan | 437/982 |
| 88735 | 6/1982 | Japan | 437/982 |
| 59-232443 | 12/1984 | Japan | 148/DIG. 42 |

OTHER PUBLICATIONS

Ghandi, S. K., *VLSI Fabrication Principles*, John Wiley and Sons, 1983 p. 494.
Colclaser, R. A., *Microelectronics*, John Wiley and Sons, 1980 p. 122.

*Primary Examiner*—Olik Chaudhuri
*Assistant Examiner*—George R. Fourson
*Attorney, Agent, or Firm*—Robert E. Bushnell

[57] ABSTRACT

A method of forming a PSG layer on a semiconductor substrate containing semiconductor elements by chemical vapor deposition is characterized in that the concentration of the PSG layer is gradually increased from the substrate surface toward the uppermost surface of the PSG layer.

1 Claim, 3 Drawing Sheets

FIG.I(A)
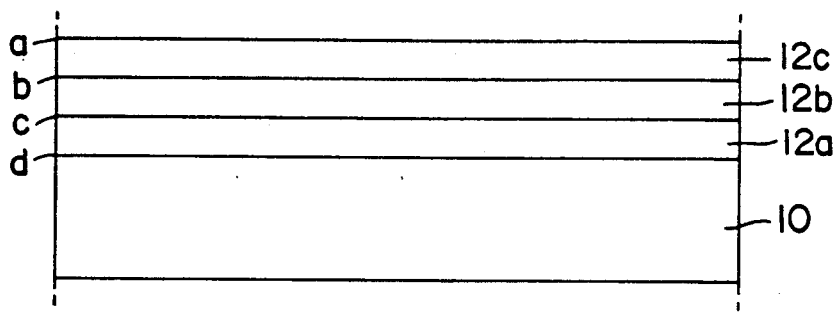
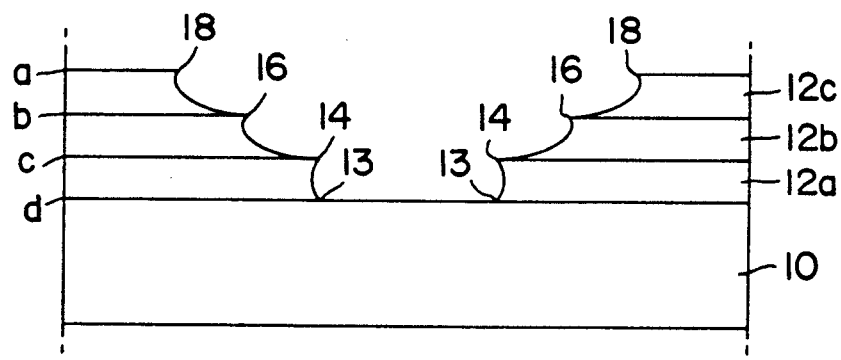
FIG.I(B)
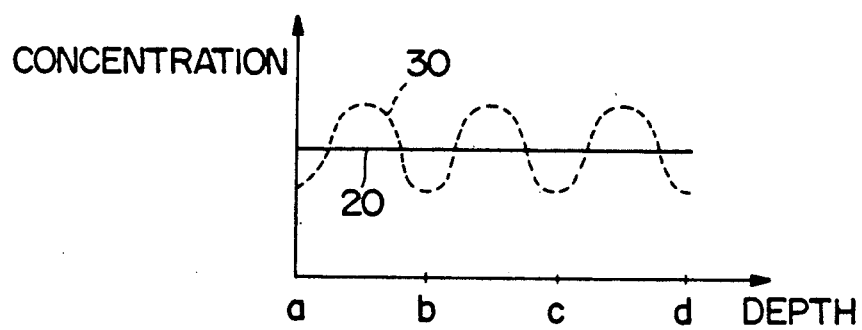
FIG. 2

METHOD OF FABRICATING A SEMICONDUCTOR DEVICE

TECHNICAL BACKGROUND

The present invention concerns a method of fabricating a semiconductor device, and more particularly, a method of forming Phosphor Silicate Glass (hereinafter referred to as PSG) layers by chemical vapor deposition (hereinafter referred to as CVD).

The PSG layer is widely used in the semiconductor fabrication process.

With reference to the attached drawings, the PSG layers formed by the conventional method will firstly be considered. FIGS. 1(A) and (B) illustrate an example of the PSG layers formed on a semiconductor substrate, which is etched, and FIG. 2 illustrates the distribution of the concentration according to the depths of the PSG layers. Referring to FIG. 1(A), PSG layers 12a, 12b, 12c are formed on a semiconductor substrate 10 by the conventional CVD. The boundary surfaces of the layers are designated as the reference numerals a, b, c, d sequentially from above. As shown by the reference numeral 20 in FIG. 2, the phosphorous concentration is constant regardless of the depths of the PSG layers.

However, if the PSG layers are subjected to heat treatment, and reflowing, the phosphorous concentration of each layer, as shown by the reference numeral 30 in FIG. 2, has an irregular distribution, and particularly is reduced in the boundary surfaces.

On the other hand, if the phosphorous concentration becomes different according to the latters, the etching speed of each layer also becomes different. Namely, after forming a photoresist pattern on the uppermost surface of PSG layers by the conventional photolithography, if the PSG layers 12c and 12b are subjected to isotropic etching, and the PSG layer 12a to anisotropic etching, at the boundary surfaces a, b, c, d are sharp edges produced 13, 14, 16, 18 as shown in FIG. 1(B). Such sharp edges serve as a main cause to result in the cut-off phenomenon when vapor-depositing a different layer on the PSG layers.

SUMMARY OF THE INVENTION

It is an object of the present invention to provide a method of forming a PSG layer which can prevent production of sharp edges when etching the PSG layer formed by CVD.

According to the present invention, the method of forming a PSG layer on a semiconductor substrate containing semiconductor elements by CVD is characterized in that the concentration of the PSG layer is gradually increased from the substrate surface toward the uppermost surface of the PSG layer.

BRIEF DESCRIPTION OF THE DRAWINGS

FIGS. 1(A)-(B) illustrate an example of the conventional etched PSG layers;

FIG. 2 illustrates the distribution of the phosphorous concentrations, comparing the initial PSG layers of FIG. 1(A) with the heat-treated PSG layers;

DETAILED DESCRIPTION OF THE PREFERRED EMBODIMENT

Figure 3A:
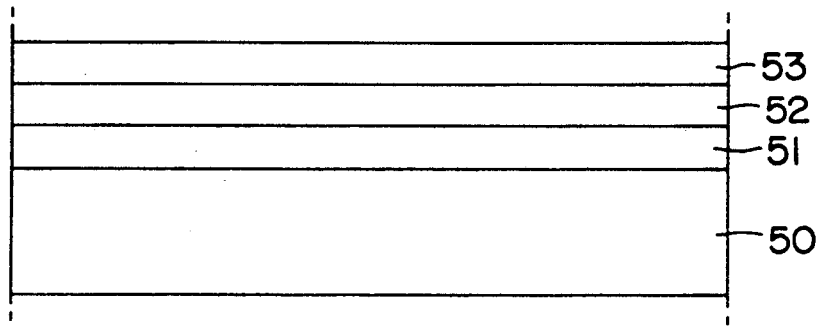
FIGS. 3(A)-(D) are schematic diagrams for illustrating the process of forming the PSG layers according one embodiment of the present invention.
Figure 4:
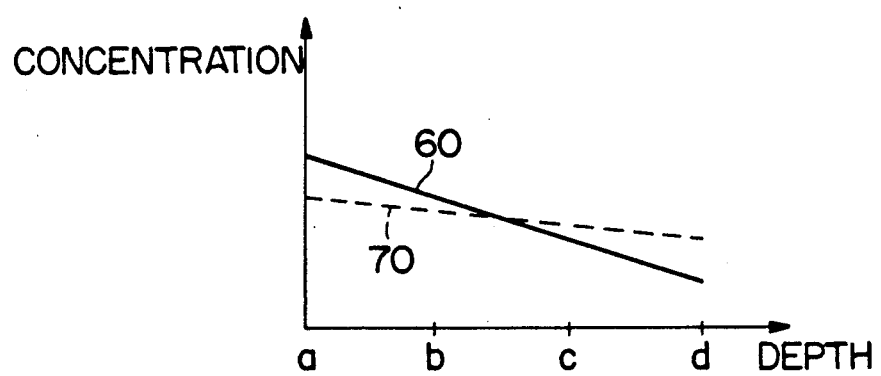
FIG. 4 illustrates the distribution of the phosphorous concentrations, comparing the initial PSG layers of the present invention with the heat-treated PSG layers thereof.

Referring to FIG. 3(A), on a semiconductor substrate 50 are first PSG layer (51), second PSG layer (52), and third PSG layer (53) deposited sequentially by the conventional CVD. The phosphorous concentration of the PSG layers is gradually increased from the substrate surface toward the uppermost surface of the layers. Namely, the reference numeral 60 in FIG. 4 indicates this condition. Thereafter, if the PSG layers are heat-treated to reflow, the distribution of the phosphorous concentration as shown by the reference numeral 70 in FIG. 4 is almost uniformly redistributed through all the PSG layers, and particularly, the boundary surfaces do not make the reduction of the phosphorous concentration, thereby resulting in a continuous redistribution of the phosphorous concentration.

Figure 3B:
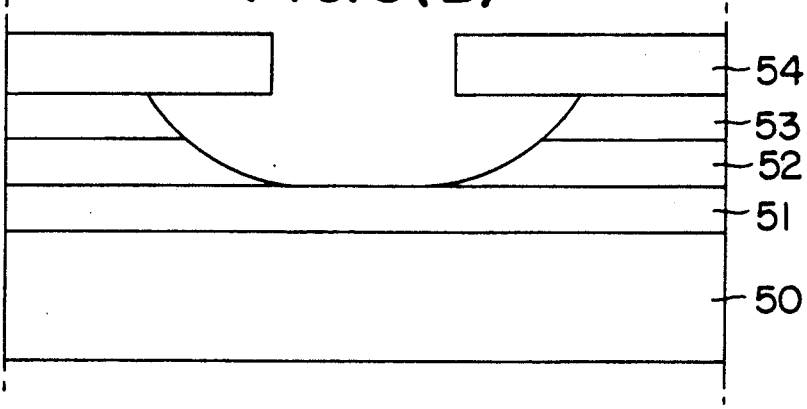
Figure 3C:
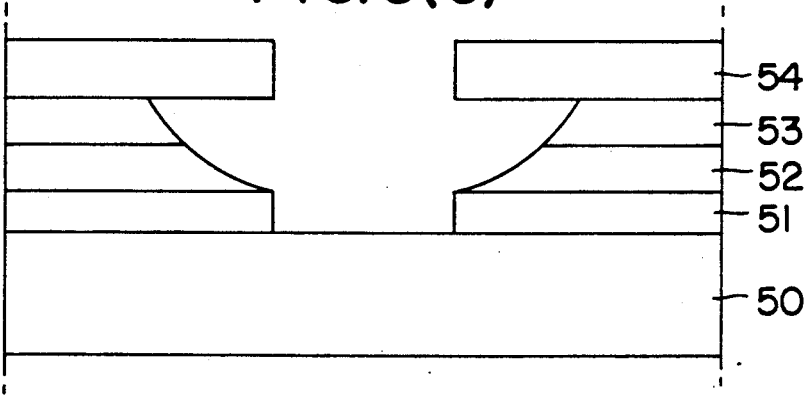

Subsequently, on the third PSG layer (53) a photoresist pattern 54 is formed by conventional photolithography. If the third and second PSG layers 53 and 52 are subjected to isotropic etching, an edge profile is formed as shown in FIG. 3(B) without producing sharp edges due to the equal etching speed of the two layers. Thereafter, if the first PSG layer 51 is subjected to anisotropic etching, the edge profile is formed as shown in FIG. 3(C).

Figure 3D:
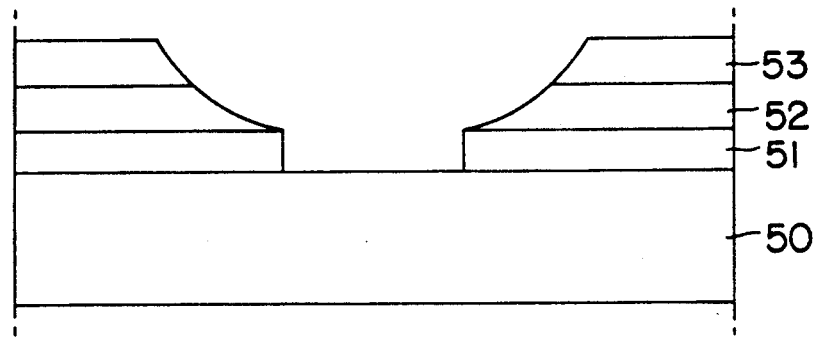

Finally, when removing the impurities on the substrate or forming a contact, the thin oxide film on the substrate is etched by 100:1 HF, and the photoresist pattern 54 is removed, thereby creating the resulting edge profile as shown in FIG. 3(D).

As described above, since the method of the present invention forms the PSG layer by CVD so as to increase the phosphorous concentration gradually from the substrate toward the uppermost surface of the layer, the sharp edges are produced in the PSG layers when etching, and cut-off of the upper different layer due to sharp edges is prevented, so that the quality and the yield rate are improved.

What is claimed is:

1. A method of fabricating a semiconductor device, comprising:
    forming a PSG layer on a semiconductor substrate containing semiconductor elements, by chemical vapor deposition, while varying the concentration of phosphorous in the PSG layer to gradually increase from the substrate surface toward the uppermost surface of the PSG layer; and
    redistributing the concentration of phosphorous in the PSG layer.

* * * * *